United States Patent [19]
Veeser et al.

[11] Patent Number: 5,719,497
[45] Date of Patent: Feb. 17, 1998

[54] LENSLESS MAGNETO-OPTIC SPEED SENSOR

[75] Inventors: Lynn R. Veeser; Peter R. Forman, both of Los Alamos; Patrick J. Rodriguez, Santa Fe, all of N. Mex.

[73] Assignee: The Regents of the University of California, Los Alamos, N. Mex.

[21] Appl. No.: 647,364

[22] Filed: May 9, 1996

[51] Int. Cl.$^6$ .................... G01P 3/487; G01P 3/36; G01R 33/032; G02F 1/095
[52] U.S. Cl. .................. 324/174; 250/227.21; 324/775; 324/207.13; 324/207.25; 324/244.1; 385/12
[58] Field of Search ................ 324/96, 173–175, 324/207.13, 207.25, 244.1; 250/225, 227.11, 227.14, 227.21, 231.1, 231.13, 231.18, 230; 359/280, 281, 284, 484; 385/6, 12

[56] References Cited

U.S. PATENT DOCUMENTS

| | | |
|---|---|---|
| 4,843,232 | 6/1989 | Emo et al. .................. 324/175 X |
| 4,947,035 | 8/1990 | Zook et al. . |
| 5,038,102 | 8/1991 | Glasheen .................. 324/175 |
| 5,192,862 | 3/1993 | Rudd, III . |
| 5,200,697 | 4/1993 | Adler et al. . |
| 5,463,316 | 10/1995 | Shirai et al. .................. 324/244.1 |
| 5,602,946 | 2/1997 | Veeser et al. .................. 324/207.25 X |

FOREIGN PATENT DOCUMENTS

| | | | |
|---|---|---|---|
| 6-242196 | 9/1994 | Japan .................. | 324/244.1 |

OTHER PUBLICATIONS

Brian J. Zook et al., "Fiber Optic Tachometer Based On The Faraday Effect," Appl. Optics 28, 1991 (1989).
D.M. Gualtieri et al., "Bismuth Rare–Earth Iron Garnet Composition For A Magneto-Optical Wheel Rotation Rate Sensor," J. Appl. Phys. 69, 5978 (1991).
T. Numata et al., "Improved Sensitivity In Novel Scheme Of Magneto–Optical Field Sensor," IEEE Trans. On Magnetics 27, 5393 (1991).
M. N. Deeter, "Domain Effects In Faraday Effect Sensors Based On Iron Garnets," 8th Optical Fiber Sensors Conference, Monterey, Calif., Jan. 29–31, 1992.

Primary Examiner—Gerard R. Strecker
Attorney, Agent, or Firm—Samuel M. Freund

[57] ABSTRACT

Lensless magneto-optic speed sensor. The construction of a viable Faraday sensor has been achieved. Multimode fiber bundles are used to collect the light. If coupled directly into a 100 or 200 μm core fiber, light from a light emitting diode (LED) is sufficient to operate the sensor. In addition, LEDs ensure that no birefringence effects in the input fiber are possible, as the output from such light sources have random polarization. No lens is required since the large diameter optical fibers and thin crystals of materials having high Verdet constants (such as iron garnets) employed permit the collection of a substantial quantity of light. No coupler is required. The maximum amount of light which could reach a detector using a coupler is 25%, while the measured throughput of the fiber-optic bundle without a coupler is about 42%. All of the elements employed in the present sensor are planar, and no particular orientation of these elements is required. The present sensor operates over a wide range of distances from magnetic field sources, and observed signals are large. When a tone wheel is utilized, the signals are independent of wheel speed, and the modulation is observed to be about 75%. No sensitivity to bends in the input or output optical fiber leads was observed. Reliable operation was achieved down to zero frequency, or no wheel rotation.

16 Claims, 4 Drawing Sheets

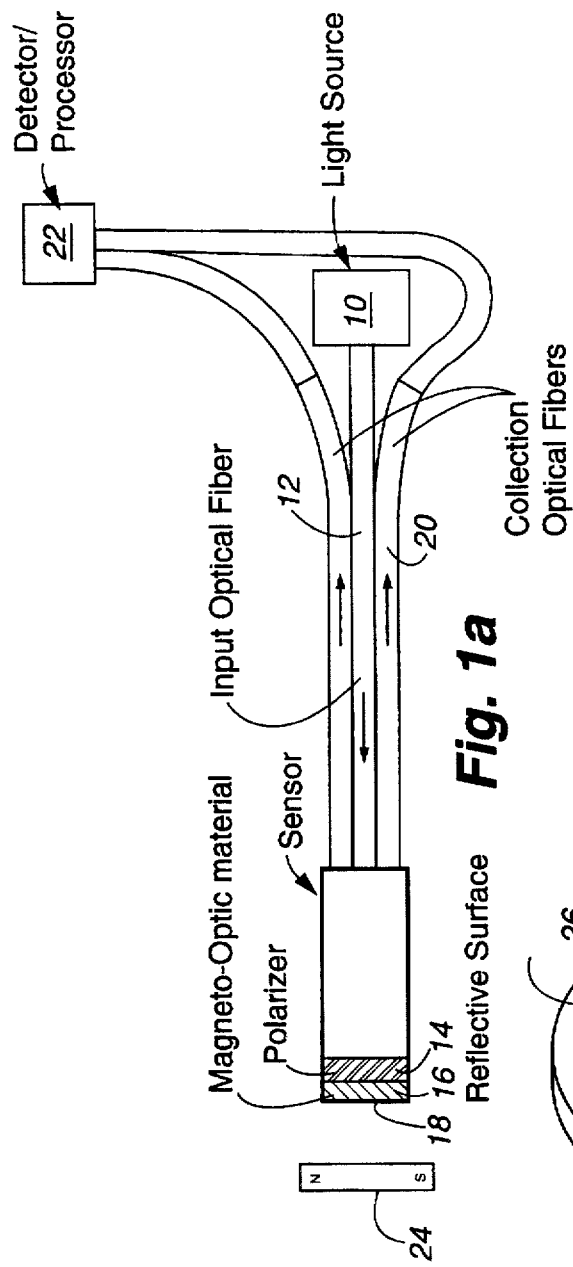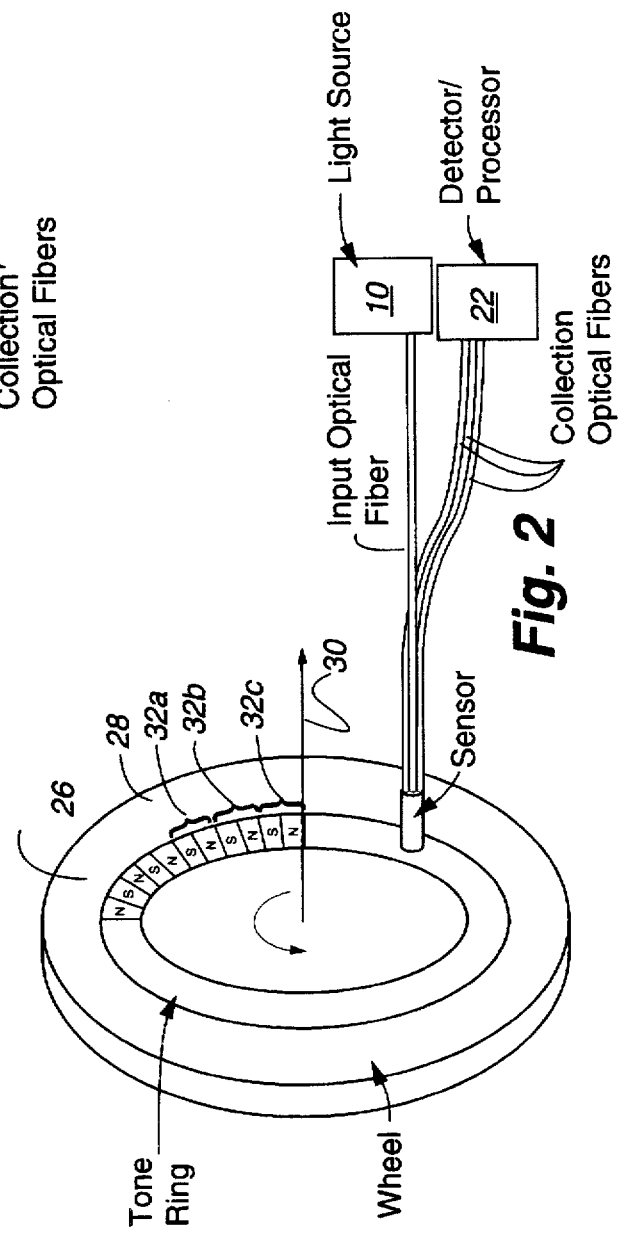

LENSLESS MAGNETO-OPTIC SPEED SENSOR

The invention was made with government support under Contract No. W-7405-ENG-36 awarded to The Regents of the University of California by the U.S. Department of Energy. The government has certain rights in this invention.

The present invention relates generally to optical apparatus for detecting changes in a magnetic field and, more particularly, to apparatus for detecting variations in magnetic field resulting from the motion of at least one magnet, and apparatus for measuring the rotational velocity of a wheel.

FIELD OF THE INVENTION

Background of the Invention

Automobile wheel bearings often include an integral sensor to detect the wheel speed and rotational orientation for applications such as anti-lock brake systems, traction control, and speedometers. In the past, such sensors consisted of an external-toothed ring rotating with the wheel and an inductive loop to detect the speed. More modern sensors include a small ring of magnetic poles, known as a "tone ring," attached to the wheel bearing so as to rotate with the wheel, and a sensor, such as a Hall-effect magnetic transducer or a winding coil, which generates an electrical signal as the magnetic field changes. See, e.g., U.S. Pat. No. 5,200,697 for "Hub And Bearing Assembly With Integrated Rotation Sensor Including A Tone Ring And Annular Transducer," which issued to Jonathan M. Adler and Kevin J. Fontenot on Apr. 6, 1993. The wheel speed is determined from the frequency of the magnetic poles going past the transducer.

In order to save weight and electrical consumption, and to obtain higher data transfer rates, automobile manufacturers are increasingly using optical fiber communication systems rather than those requiring copper wires. Optical sensors typically rely on modulated or changing light intensity, and use a photoelectric device to convert variations in light intensity into electrical signals that can be further processed using well-known electronics.

For example, optical speed sensors are known that utilize the Faraday rotation effect to detect the presence of a magnetic field. In the Faraday effect, the polarization direction of light in a crystal rotates in response to a magnetic field along the propagation direction. The polarization rotation direction remains the same when the light propagation direction is reversed, so that the rotation angle is doubled by sending the light back through the crystal by means of a mirror. A Faraday transducer may be constructed by detecting changes in the intensity of the light transmitted through a polarizer as the magnetic field changes. Often, the rear surface of the crystal is made reflective in order to serve as a mirror, doubling the sensitivity of the transducer. Unpolarized light from a light emitting diode can be transported to the crystal by an optical fiber, and a single piece of polarizing film serves as both polarizer and analyzer. The change in return light intensity from the crystal is monitored and used to determine the presence or absence of a magnetic field.

The proportionality constant for Faraday rotation, the Verdet constant, is a property of the crystal material, but it is particularly large for a class of materials known as iron garnets. The Faraday effect in iron garnets saturates at large fields, so that the crystal can be made to produce at most 90° of total rotation at saturation, thereby ensuring that the transmitted signal is a monotonic function of the field. Although wheel sensors have also been made from yttrium iron garnet crystals (See, e.g., "Fiber Optic Tachometer Based On The Faraday Effect," by Brian J. Zook and Clifford R. Pollock, Appl. Optics 28, 1991 (1989), and U.S. Pat. No. 4,947,035 for "Fiber Optic Transducer Using Faraday Effect," which issued to Brian J. Zook et al. on Aug. 7, 1990), bismuth iron garnet (BIG) retains special interest since thin films thereof can be used, thereby eliminating the requirement for collimating lenses and significantly reducing the cost of the sensor. See, e.g., "Bismuth Rare-Earth Iron Garnet Composition For A Magneto-Optical Wheel Rotation Rate Sensor," by D. M. Gualtieri et al., J. Appl. Phys. 69, 5978 (1991), where lensless coupling of multimode glass fibers to a polarizer/garnet/analyzer sandwich provides the basis of a two-port, fiberoptic wheel rotation rate sensor also having an integral biasing is described. The authors report significant light loss arising from the geometry employed. However, domain boundaries in iron garnets can diffract a significant fraction of the light out of the beam when the beam diameter is small, as is the situation when a lens is not employed. The diffraction decreases in the presence of a magnetic field because the domains are aligned, thereby reducing loss of the detected signal. Thus, if there is significant diffraction, the signal loss due to diffraction decreases in opposition to the signal reduction resulting from Faraday rotation. It is possible to construct a fiber optic wheel rotation sensor using diffractive effects only, thereby eliminating the need for a polarizer. See, e.g., U.S. Pat. No. 5,192,862 for "Polarizerless Magneto-Optic Speed And Torque Sensor," which issue to Robert E. Rudd, III on Mar. 9, 1993, and "Improved Sensitivity In Novel Scheme Of Magneto-Optical Field Sensor," by T. Numata et al., IEEE Trans. On Magnetics 27, 5393 (1991). Unfortunately, the domain structure is unstable in the presence of changing fields, so that signal intensities are unstable and vary over time in an unpredictable manner. See, e.g., "Domain Effects In Faraday Effect Sensors Based On Iron Garnets," by M. N. Deeter in 8$^{th}$ Optical Fiber Sensors Conference, Monterey, Calif., Jan. 29–31, 1992, where it is pointed out that iron garnets can exhibit hysteresis and nonlinear behavior which disappear only when the material is magnetically saturated as the result of a bias field. This technique typically requires a permanent magnet which adds to the size and weight of a sensor and may perturb the field to be measured.

Since the Faraday rotation depends on the component of the optical path along the magnetic field direction, all the light is rotated by the same angle, independent of whether the light was diffracted, as long as the magnetic field is uniform over the crystal dimensions.

Accordingly, it is an object of the present invention to provide a lensless, stable optically based apparatus for detecting the presence of magnetic fields.

Another object of the invention is to provide a lensless, stable optically based apparatus for measuring the speed of rotation of a wheel.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the Faraday effect magnetic field detector hereof, may comprise in combination: a magneto-optic material having a high Verdet constant and further having two opposing planar and parallel faces; a light source for generating light having wavelengths which are transmitted by the magneto-optic material; a polarizer disposed in front of one face of the magneto-optic material; a lensless means for directing the light through the polarizer and into the magneto-optic material through a portion of this face, such that the divergence of the light emerging from the light directing means is large when compared to diffraction of the light by domains within the magneto-optic material; reflective means disposed behind the other face of the magneto-optic material for reflecting light which has passed through the magneto-optic material back therethrough, through the first parallel face thereof and through the polarizer; means for collecting part of the light returning through and analyzed by the polarizer which has emerged from the outside of the portion of the face into which the light was directed by the lensless directing means; and means for detecting the collected light, producing thereby a signal; whereby the signal may be related to the strength of the magnetic field.

Preferably, the lensless means for directing light through the polarizer and into the magneto-optic material includes a multimode optical fiber.

It is also preferred that the means for collecting part of the light returning through the magneto-optic material includes at least one multimode optical fiber.

Preferably also, the magneto-optic material is selected from the group consisting of bismuth iron garnet and yttrium iron garnet.

In another aspect of the present invention, in accordance with its objects and purposes, the Faraday effect wheel rotational speed sensor hereof, may comprise in combination: a magneto-optic material having a high Verdet constant and further having two opposing and parallel planar faces; a light source for generating light having wavelengths which are transmitted by the magneto-optic material; a polarizer disposed in front of one face of the magneto-optic material; lensless means for directing the light through the polarizer and through a portion of one face of the magneto-optic material, such that the divergence of the light emerging from the light directing means is comparable when compared to diffraction of the light by domains within the magnetooptic material and the collection aperture is large when compared to displacement by the domains; reflective means disposed behind the other face of the magneto-optic material for reflecting light which has already passed once through the magneto-optic material, back therethrough and out of the face through which the light entered the magneto-optic material outside of the portion thereof into which the light was originally directed by the lensless directing means, and through the polarizer; means for collecting part of the light returning through and analyzed by the polarizer; means for detecting the collected light, producing thereby a signal; and a tone ring having regions of alternating magnetic poles which interact with the magneto-optic material, the tone ring having an axis collinear with the axis of the wheel and being affixed to a face thereof; whereby the signal may be related to the speed of rotation of the wheel.

Preferably, the lensless means for directing light through the polarizer and into the magneto-optic material includes a multimode optical fiber.

It is also preferred that the means for collecting part of the light returning through the magneto-optic material includes at least one multimode optical fiber.

Preferably also, the magneto-optic material is selected from the group consisting of bismuth iron garnet and yttrium iron garnet.

Benefits and advantages of the present invention include a sensitive, reliable, inexpensive and rugged fiber optic wheel rotation sensor which may be sealed against hostile environments.

BRIEF DESCRIPTION OF THE DRAWINGS

The accompanying drawings, which are incorporated in and form a part of the specification, illustrate the embodiments of the present invention and, together with the description, serve to explain the principles thereof. In the drawings:

FIG. 1a is a schematic representation of a general embodiment of the magnetic field detection apparatus of the present invention, showing the cooperation among the light source and detector, the light delivery and receiving optical fibers, the polarizer, the magneto-optic material and the reflective surface.

FIG. 2 is a schematic representation of another embodiment of the invention, showing the use of the magnetic field detection apparatus illustrated in FIG. 1a hereof for determining the speed of rotation of a wheel.

DETAILED DESCRIPTION

Figure 1B:
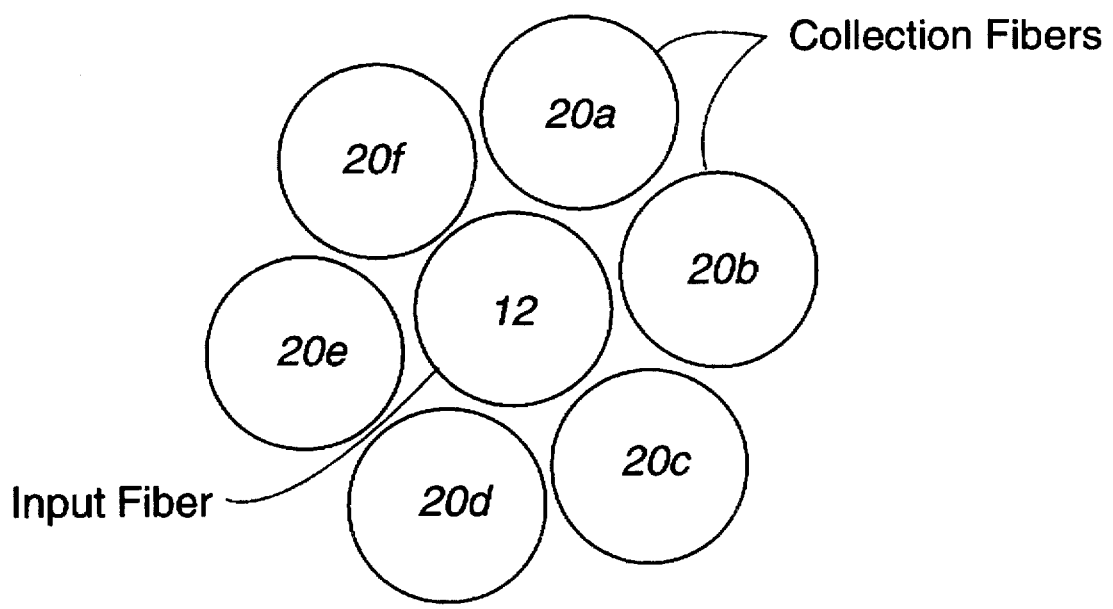
FIG. 1b is a cross sectional view of a typical arrangement of light input and receiving optical fibers.

Briefly, the present invention includes a fiber-optic magnetic field detector which employs a polarizer, a magneto-optic material, one multimode fiber that introduces the light to the magneto-optic material after passing through the polarizer, and at least one multimode fiber outside of the light introducing fiber for collecting light directed a second time through the material and the polarizer. The basis of the rotation sensor is the magneto-optic detection of the magnetic fields from a wheel of permanent magnets fixed to a wheel of the automobile. Bismuth iron garnet (BIG) crystals serve as the magneto-optic sensing elements, although other magneto-optic materials may be employed. In addition to having a large Verdet coefficient (thin crystals, 100–300 μm thick, depending on the wavelength employed, are sufficient to provide saturation of the crystal and 45° of Faraday rotation in a magnetic field of a few hundred Gauss), however, BIG crystalline films have a domain structure (typically stripes of the order of 10 μm thick) which produces diffraction of light traversing the material. As stated hereinabove, this diffraction interferes with conventional Faraday-effect sensors where quasi-parallel light is made to traverse the BIG crystal. That is, magnetic field strengths required for significant Faraday rotation are sufficiently large to align the domains and extinguish the diffraction. Unfortunately, the results of the two effects are opposite in that the Faraday signal decreases as the field is increased, while corresponding domain alignment decreases the diffractive beam losses and the light detected increases. In the past, Faraday-effect experiments utilized crystals with much smaller Verdet constants, for example, yttrium-iron garnet.

However, bulk crystals were required to provide sufficient Faraday rotation, which necessitated the use of a focusing lens. The resulting beam diameter was much larger than the domain dimension, so the diffraction fraction was a constant function of the crystal geometry.

To avoid the competition between the Faraday and diffraction effects, attempts have been made which exploit diffraction effects only by removing the polarizer required for a Faraday sensor. However, the use of the diffraction effect to make a wheel sensor has not led to reliable results. While it has been possible by using such sensors to achieve significant modulation (30%), it has been found necessary by the present inventors to frequently optimize the location of the light fiber relative to the magneto-optic material. It is believed by the present inventors that exposing the magneto-optic material to changing magnetic fields causes the domains to reposition when the magnetic field is reduced (for example, between magnetic poles of the tone wheel). If the sensing optical beam diameter is small, the domains drift within the illuminated volume, thereby significantly changing the light modulation level. By employing a large, parallel light beam, however, it becomes difficult to separate the diffracted and the undiffracted light.

With a multimode fiber having a core diameter of at least 50 µm, theta will generally be some domains within the light beam when the crystal is placed against the fiber end. If a mirror is placed against the opposite face of the crystal, or if the crystal face itself is coated to be reflective, light collected in the fiber and returned to the sensor will usually have some modulation. The modulation depends on the location of the domains, as this determines the amount of diffraction. Also important are the beam divergence from the fiber, the diffraction angle, and the crystal thickness, which together determine the relative amounts of diffracted and undiffracted light returned to the fiber. Since the domains can reappear in different locations after being aligned by a saturating field, the modulation percentage is unstable. Another instability arises in the fiber because if it is moved or if its temperature changes, the distribution of the mode structure can be affected. This results in dramatic changes in the modulation level.

If a single-mode fiber with a core of approximately 9 µm diameter is employed, the sensitivity to fiber movement is removed, but the sensitivity to the instantaneous domain locations is greatly increased, as the beam diameter leaving the fiber is comparable to the domain size. A graded-index (GRIN) lens can be used to expand the beam size to encompass several domains, but the adjustments are tedious, the cost of the sensor is increased, and there is no guarantee that the diffraction will be sufficient to remove the diffracted light far enough out of the beam to produce much modulation.

If a transmission polarizer is added to the GRIN-lens sensor, a conventional Faraday sensor is constructed. This has all the complexity of the previously described sensor with the additional element of a polarizer. Like the diffraction sensor, the Faraday sensor is sensitive to variations in the contribution of diffraction to the total signal. When domain diffraction is small the Faraday sensor would work while the diffraction sensor is not useful. When domain diffraction is large the diffraction sensor is viable, but the Faraday sensor produces unpredictable results. To fabricate a reliable sensor it is necessary to keep the amount of diffracted light in the signal relatively stable.

If, instead of collimating the light with a lens, a large-area diverging light beam is used to cover many domains, Faraday rotation may be reliably and reproducibly employed. Faraday rotation derives from the scalar product of the magnetic field in the sensor element with the propagation vector of the light. If the magnetic field within the sensor is of a uniform strength and direction, diffraction due to domains will not significantly contribute to a signal change, provided that the diffracted light is collected, along with the undiffracted light, by the at least one fiber collecting and directing the transmitted light to a light intensity detector.

Reference will now be made in detail to the present preferred embodiments of the invention, examples of which are illustrated in the accompanying drawings. Similar or identical structure is identified with identical callouts. Turning now to FIG. 1a, an embodiment of the apparatus of the present invention is schematically shown in its most general form. Light from light source, 10, is directed into input optical fiber, 12. Light emerging from optical fiber 12 is made incident on polarizer, 14, which is contiguous with the front face of magneto-optic material, 16. After passing through the magneto-optic material, the light is reflected by means of reflective surface, 18, through magneto-optic material 16 and polarizer 14, and is collected by at least one collection fiber, 20. Seven 200 µm core fibers were employed. The desired configuration was obtained by inserting the seven fibers into a standard ST fiber-optic connector which was drilled to accommodate the fiber bundle. Light from a laser is introduced into the center fiber while the remaining six fibers are bundled together and brought back to the detector. Light from a 1.3 µm laser was introduced into a single-mode optical fiber which was connected directly to the input multimode center fiber. To assure that this arbitrary arrangement filled the multimode fiber, the multimode fiber was wrapped around a 12 mm diameter mandrel in six turns. This scrambles the spatial mode distribution and the polarization state of the light. In addition, the procedure removes the very high order modes, thereby reducing the divergence of the light emitted from the fiber. A small (5%) variation in signal amplitude was observed if the six turn mandrel was omitted, but essentially none was observed when it was in place. It should be mentioned that other light sources, such as light-emitting diodes may also be employed. In fact, the laser diode was operated both as a laser, or below laser threshold, as a light-emitting diode (LED). Equivalent modulation was obtained whether operating in the lasing or LED mode, but the signal amplitude was smaller for the LED experiments.

Light entering collection fibers 20 is detected using detector/processor, 22. Movement of magnet, 24, changes the Faraday rotation of the polarized light passing through magneto-optic material 16 and analyzed by polarizer 14, changing the intensity of light reaching detector/processor 22. Certain advantages derive from this arrangement of parts for the present apparatus: 1) The Faraday sensor can be easily assembled and does not require adjustments; all elements are planar and can be simply stacked together. 2) There is no critical orientation of the polarizer, as it is both polarizer and analyzer, and hence it is self-orienting; and 3) Most of the light is collected, regardless of the degree of diffraction present, to minimize the modulation due to diffraction. An added advantage is that a high-Verdet material, BIG, may be used in a film geometry sufficiently thin so as to not require lenses to collimate and collect the light directed through the crystal. In U.S. Pat. No. 5,192,862 by Rudd, supra, it is claimed that removing the polarizer to make a diffraction sensor has a cost advantage over the Zook geometry in U.S. Pat. No. 4,947,035, supra. In the present invention, the polarizer is included but the lenses are removed, providing a more significant cost advantage.

FIG. 1b is a cross sectional view of a typical arrangement of light input fiber 12 and receiving optical fibers 20a–f. There an unknown amount of diffraction in the crystal of the light from the central fiber, but the majority of the light remains in a central, diverging beam from the end of the fiber. The seven fiber array bundle relies on the light from the center fiber diverging at some angle, so that after some distance of propagation through the polarizer and the crystal, much of the reflected light can enter one of the six receiver fibers. As stated hereinabove, for a uniform field the Faraday rotation for all rays is the same, whether diffracted or not. The six fibers collect most of the light provided by the central optical fiber, both diffracted and undiffracted, and carry it to the detector/processor. It should be mentioned that fewer than six collection fibers might be employed; six were used for efficiency. By symmetry, each fiber has about the same modulation ratio, and if a smaller signal suffices, one or two collection fibers will work well. A 1 mm thick polarizer is attached to the polished ends of the seven fiber bundle. No particular orientation is required, since the input light is essentially unpolarized, and the single polarization element is both the polarizer and the analyzer. A 380 μm thick BIG sensor element is attached to the polarizer. The reflector behind the sensor element returns the light to the fibers and causes a doubling of the Faraday rotation. Two types of reflectors have been tested, dielectric and metallic, with equally good results. The fabrication of a sensor composed of this type of element is particularly simple, as no rotational orientation of the elements is required, and all the components are flat surfaces.

FIG. 2 is a schematic representation of another embodiment of the invention, showing the use of the magnetic field detection apparatus illustrated in FIG. 1a hereof for determining the speed of rotation of a wheel. Tone ring, 26, having magnets, 32a, 32b, etc., is rigidly mounted on wheel, 28, such that the two share a common axis of rotation, 30.

Figure 3:
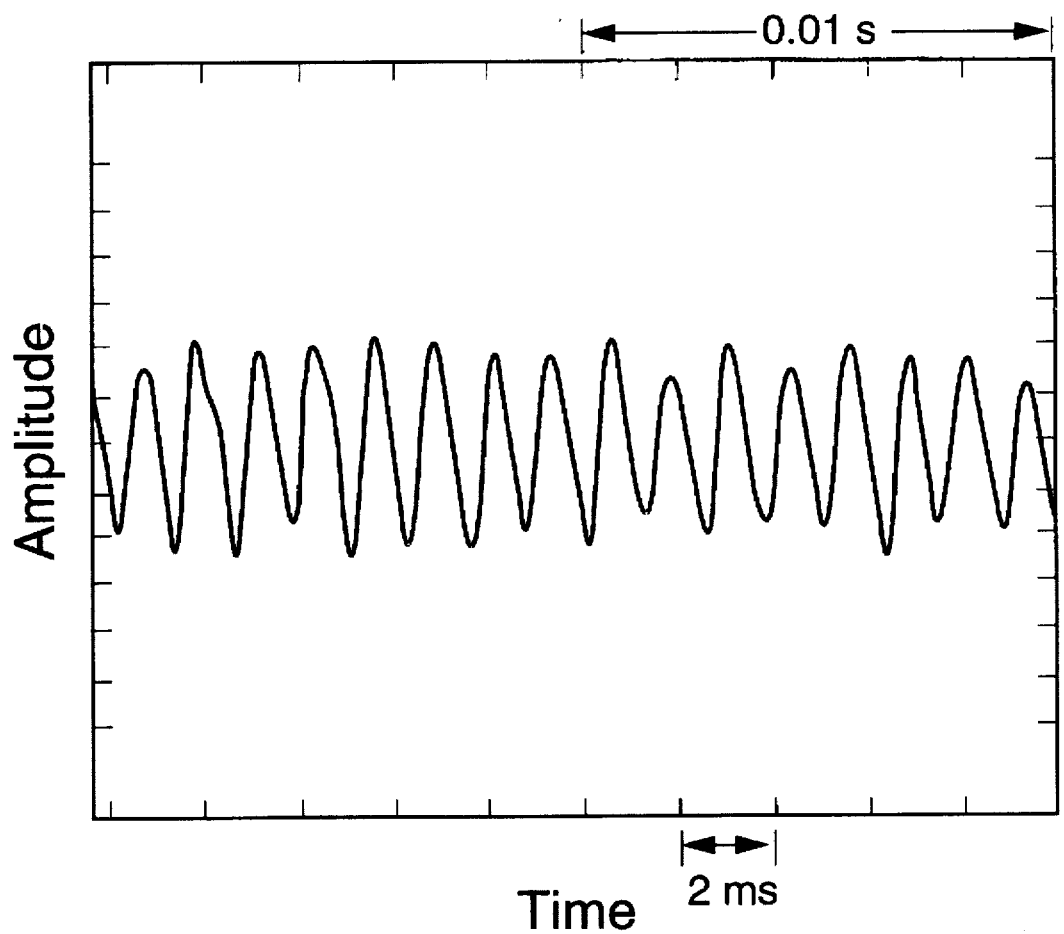
FIG. 3 is a graph of the detected intensity versus time for a chosen speed of wheel rotation generated by the apparatus shown in FIG. 2, hereof.

FIG. 3 shows the signal generated by detector/processor 22 in FIG. 2 hereof in response to an 18-magnet rotating tone wheel. About 75% modulation was observed for the 12 mm magnets (32a, 32b, etc., in FIG. 2 hereof).

Although the domain distribution across the face of the central fiber is unknown, both the distance from the fiber end to the mirror and the fiber diameters were optimized for the available BIG crystals. It was found that 200 μm diameter fibers gave a stable signal with the above-quoted modulation level of approximately 75%. If crystals with substantially smaller domains can be obtained, or if thinner crystals can be used, the sensor can be reconfigured to use smaller, less-expensive fibers. It is also possible that at shorter wavelengths, say 780 μm, where absorption in the BIG is not as large, it is anticipated that 100-μm-thick crystals and 100-μm-core fibers will suffice. Even with a multimode fiber having a core diameter of 50 μm, there will generally be some domains within the light beam when the crystal is placed against the fiber end. If a mirror is placed against the opposite face of the crystal, or if the crystal face itself is coated to be reflective, light collected in the fiber and returned to the sensor will usually have some modulation. As stated, the extent of modulation depends on the location of the domains, as this determines the amount of diffraction. Also important are the beam divergence from the fiber, the diffraction angle, and the crystal thickness, which together determine the relative amounts of diffracted and undiffracted light returned to the fiber. Since the domains can reappear in different locations after being aligned by a saturating field, the modulation percentage is unstable. Another instability arises in the fiber because if it is moved or if its temperature changes, the distribution of the mode structure can be affected. The results can be dramatic changes in the modulation level which are overcome by the apparatus of the present invention.

Light which has not traversed the BIG sensor element may enter the collection fibers, or perhaps the direction or strength of the magnetic field not being uniform within the BIG crystal, may be responsible for the extent of modulation being 75% instead of approaching 100%. To test the latter hypothesis, the sensor was deployed in the magnetic field of a linear solenoid which produces a highly uniform magnetic field of variable field strength. No improvement in the percentage modulation could be achieved for fields well beyond the optimal field. From this it may be concluded that attention to reflections and scattering are required to optimize the sensor design, but the apparatus of the present invention is suitable as a production sensor in its present form.

Figure 4:
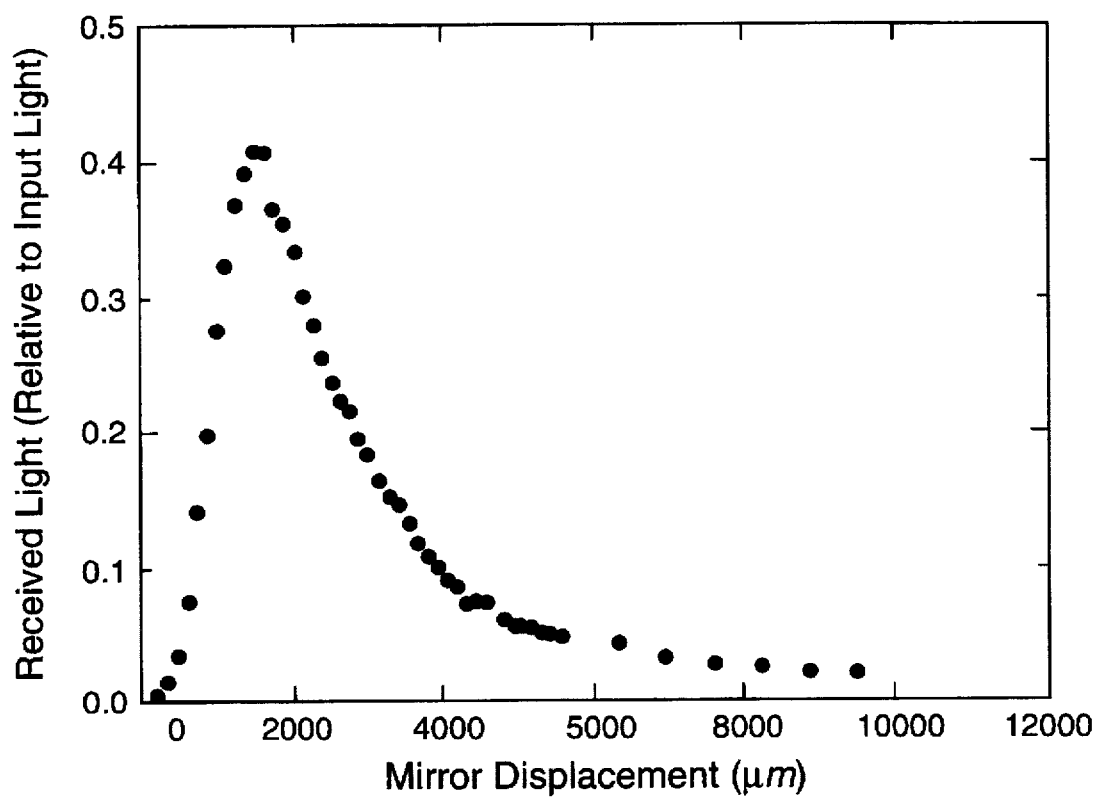
FIG. 4 is a graph of the ratio of the light received by the light detector shown in FIG. 1a hereof to the light incident on the reflective as a function of distance from the input optical fiber to the reflective surface in the absence of the magneto-optic material and the polarizer.

The divergence from the light delivery fiber 12 was measured by placing the fiber-optic bundle 12, 20 in front of mirror 18, and moving the mirror away from the end of the bundle while measuring the light received by the receiving fibers for constant light intensity supplied by the light delivery fiber. The results are shown in FIG. 4 for the 200 μm core optical fibers employed and deployed as in FIG. 1b hereof. Since there is a maximum collected light intensity position for the mirror, the sensor geometry may readily be optimized, once the refractive effects of the polarizer and the magneto-optic crystal are taken into account. The same measurements may also be made for other fiber core diameters and arrangements. For the present apparatus, it may be concluded that the light from the central fiber is emerging within a cone (half-angle) of about 4° in air. With the polarizer present, the half-angle is reduced to about 2.7° (index=1.5), and in the BIG crystal, it is only about 1.2°, assuming and index of refraction of 2.2. This small angle likely accounts for the equally good results using dielectric or metallic mirrors. For non-normal incidence there is a different phase shift for "S" polarized and "P" polarized light. With a metallic mirror this shift is closely equal to π, so there is no anomalous polarization for a Faraday measurement. Thus, metal mirrors are preferred if the angle of incidence deviates substantially from normal. For 1.2° the difference in phase for S and P polarizations is not appreciable, so the light remains essentially linearly polarized for either mirror. The metal coatings employed were too thin to exclude the magnetic flux from the sensor.

A sensor bundle consisting of 100 μm diameter core fibers was also assembled and tested. The identical sensor elements were attached to this fiber bundle. Good modulation was achieved, however the signal amplitude was unstable, drifting presumably because diffraction was changing due to the changing position of the magnetic domains, and the collection fibers were not large enough to assure that the diffracted light was collected. To reduce the area of the reflected light at the fiber bundle, a plastic polarizer having 200 μm thickness was employed, as opposed to the 1000 μm polarizer identified hereinabove. With this sensor, results comparable to those obtained with the 200 μm fiber were observed. The sensor was more sensitive to the distance from the tone wheel, however, with good operation being possible when it was close to the wheel. There is reason to consider smaller core fibers, as there is only one fourth as much glass as in the larger diameter system, a potential cost savings.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A Faraday effect magnetic field detector, which comprises in combination:
   a. a magneto-optic material having a high Verdet constant and further having a first planar face and a second planar face, the first face and the second face being substantially parallel;
   b. a light source for generating light having wavelengths which are transmitted by said magneto-optic material;
   c. a polarizer disposed in front of the first planar face of said magneto-optic material;
   d. lensless means for directing the light through said polarizer and into said magneto-optic material through a portion of the first parallel face thereof, such that the divergence of the light emerging from said light directing means is comparable when compared to diffraction of the light by domains within said magneto-optic material;
   e. reflective means disposed behind the second parallel face of said magneto-optic material for reflecting light which has passed through said magneto-optic material back therethrough, through the first parallel face thereof and through said polarizer;
   f. means for collecting part of the light returning through and analyzed by said polarizer which has emerged from the first face outside of the portion thereof into which the light was directed by said lensless directing means, said collecting means having a collection aperture which is large when compared to the diffraction of the light by the domains; and
   g. means for detecting the collected light, producing thereby a signal; whereby the signal may be related to the strength of the magnetic field.

2. The Faraday effect magnetic field detector as described in claim 1, wherein said magneto-optic material is selected from the group consisting of bismuth iron garnet and yttrium iron garnet.

3. The Faraday effect magnetic field detector as described in claim 1, wherein said lensless light directing means includes an optical fiber.

4. The Faraday effect magnetic field detector as described in claim 3, wherein said optical fiber is a multimode fiber.

5. The Faraday effect magnetic field detector as described in claim 1, wherein said reflective means is a reflective material deposited onto the second planar of said magneto-optic material.

6. The Faraday effect magnetic field detector as described in claim 1, wherein said light collecting means includes at least one optical fiber.

7. The Faraday effect magnetic field detector as described in claim 6, wherein said optical fiber is a multimode fiber.

8. The Faraday effect magnetic field detector as described in claim 1, wherein the distance between the first face and the second face of said magneto-optic material is chosen such that the polarization of the light emerging from the first face of said magneto-optic material is rotated not more than 90° from the polarization of the light entering the first face thereof.

9. A Faraday effect wheel rotational speed sensor comprising:
   a. a magneto-optic material having a high Verdet constant and further having a first planar face and a second planar face, the first face and the second face being substantially parallel;
   b. a light source for generating light having wavelengths which are transmitted by said magneto-optic material;
   c. a polarizer disposed in front of the first planar face of said magneto-optic material;
   d. lensless means for directing the light through said polarizer and into said magneto-optic material through a portion of the first parallel face thereof, such that the divergence of the light emerging from said light directing means is comparable when compared to diffraction of the light by domains within said magneto-optic material;
   e. reflective means disposed behind the second parallel face of said magneto-optic material for reflecting light which has passed through said magneto-optic material back therethrough, through the first parallel face thereof and through said polarizer;
   f. means for collecting part of the light returning through and analyzed by said polarizer which has emerged from the first face outside of the portion thereof into which the light was directed by said lensless directing means, said collecting means having a collection aperture which is large when compared to the diffraction of the light by the domains;
   g. means for detecting the collected light, producing thereby a signal; and
   h. a tone ring having regions of alternating magnetic poles which interact with said magneto-optic material, said tone ring having an axis collinear with the axis of the wheel and being affixed to a face thereof; whereby the signal may be related to the speed of rotation of the wheel.

10. The Faraday effect wheel rotational speed sensor as described in claim 9, wherein said magneto-optic material is selected from the group consisting of bismuth iron garnet and yttrium iron garnet.

11. The Faraday effect wheel rotational speed sensor as described in claim 9, wherein said lensless light directing means includes an optical fiber.

12. The Faraday effect magnetic field detector as described in claim 11, wherein said optical fiber is a multimode fiber.

13. The Faraday effect wheel rotational speed sensor as described in claim 9, wherein said reflective means is a reflective material deposited onto the second planar face of said magneto-optic material.

14. The Faraday effect wheel rotational speed sensor as described in claim 9, wherein said light collecting means includes at least one optical fiber.

15. The Faraday effect magnetic field detector as described in claim 14, wherein said optical fiber is a multimode fiber.

16. The Faraday effect wheel rotational speed sensor described in claim 9, wherein the distance between the first face and the second face of said magneto-optic material is chosen such that the polarization of the light emerging from the first face of said magneto-optic material is rotated not more than 90° from the polarization of the light entering the first face thereof.

* * * * *